United States Patent
Wang et al.

(10) Patent No.: US 12,025,382 B2
(45) Date of Patent: Jul. 2, 2024

(54) VAPOR CHAMBER STRUCTURE

(71) Applicant: Acer Incorporated, New Taipei (TW)

(72) Inventors: Chun-Chieh Wang, New Taipei (TW);
Wen-Neng Liao, New Taipei (TW);
Cheng-Wen Hsieh, New Taipei (TW);
Kuang-Hua Lin, New Taipei (TW);
Jau-Han Ke, New Taipei (TW)

(73) Assignee: Acer Incorporated, New Taipei (TW)

( * ) Notice: Subject to any disclaimer, the term of this patent is extended or adjusted under 35 U.S.C. 154(b) by 132 days.

(21) Appl. No.: 17/325,217

(22) Filed: May 20, 2021

(65) Prior Publication Data

US 2021/0364238 A1 Nov. 25, 2021

(30) Foreign Application Priority Data

May 21, 2020 (TW) .................... 109116867

(51) Int. Cl.
*F28D 15/04* (2006.01)
*H05K 7/20* (2006.01)
*F28D 21/00* (2006.01)

(52) U.S. Cl.
CPC ....... *F28D 15/046* (2013.01); *H05K 7/20336* (2013.01); *F28D 2021/0028* (2013.01)

(58) Field of Classification Search
CPC .......... F28D 15/046; F28D 2021/0028; H05K 7/20336
See application file for complete search history.

(56) References Cited

U.S. PATENT DOCUMENTS

| 6,901,994 | B1 | 6/2005 | Jin-Cherng et al. |
| 10,012,445 | B2* | 7/2018 | Lin ........ H01L 23/427 |
| 10,458,718 | B2* | 10/2019 | Shen .......... F28D 15/0283 |
| 11,497,141 | B2* | 11/2022 | Koo .......... F28D 15/0283 |
| 2002/0023742 | A1 | 2/2002 | Dussinger et al. |
| 2004/0211549 | A1* | 10/2004 | Garner .......... F28D 15/046 431/325 |
| 2005/0145374 | A1* | 7/2005 | Dussinger .......... B22F 3/11 257/E23.088 |

(Continued)

FOREIGN PATENT DOCUMENTS

| CN | 101232794 | 7/2008 |
| CN | 104748597 | 7/2015 |

(Continued)

*Primary Examiner* — Gordon A Jones
(74) *Attorney, Agent, or Firm* — JCIPRNET

(57) ABSTRACT

A vapor chamber structure for heat dissipation of a heat source is provided. The vapor chamber structure includes a housing having a heat absorption side and a heat dissipation side, a first capillary structure disposed in the housing, and a working fluid filled in the housing. The first capillary structure is formed into cavities isolated from each other, and each of the cavities is connected between the heat absorption side and the heat dissipation side. Heat generated by the heat source is absorbed by the heat absorption side, thereby transforming the working fluid from liquid state to vapor state. The working fluid in the vapor state is transmitted to the heat dissipation side via the cavities, and is transformed to the liquid state while the heat is dissipated. The working fluid in the liquid state returns to the heat absorption side via the first capillary structure.

8 Claims, 3 Drawing Sheets

(56) References Cited

U.S. PATENT DOCUMENTS

| | | | | |
|---|---|---|---|---|
| 2009/0025910 A1* | 1/2009 | Hoffman | ............... | F28D 15/046 |
| | | | | 165/104.21 |
| 2013/0025829 A1 | 1/2013 | Huang | | |
| 2013/0098592 A1* | 4/2013 | Yang | .................... | H01L 23/427 |
| | | | | 165/185 |
| 2015/0060022 A1* | 3/2015 | Sun | ........................ | F28D 15/04 |
| | | | | 29/890.032 |
| 2017/0122672 A1* | 5/2017 | Lin | ........................ | B23K 35/00 |
| 2017/0292793 A1* | 10/2017 | Sun | ........................ | F28F 9/001 |
| 2018/0292145 A1* | 10/2018 | Sun | .................... | F28D 15/0275 |
| 2019/0145712 A1* | 5/2019 | Hsieh | .................... | F28D 15/046 |
| | | | | 165/104.26 |
| 2021/0131754 A1* | 5/2021 | Horng | ................. | F28D 15/046 |
| 2023/0138653 A1* | 5/2023 | Joshi | ....................... | B23P 15/26 |
| | | | | 62/515 |

FOREIGN PATENT DOCUMENTS

| | | |
|---|---|---|
| CN | 107278089 | 10/2017 |
| CN | 207300017 | 5/2018 |
| CN | 110514045 | 11/2019 |
| TW | 201014512 | 4/2010 |
| TW | M426065 | 4/2012 |
| TW | M532022 | 11/2016 |
| TW | 201643361 | 12/2016 |
| TW | 201712288 | 4/2017 |

* cited by examiner

VAPOR CHAMBER STRUCTURE

CROSS-REFERENCE TO RELATED APPLICATION

This application claims the priority benefit of Taiwan application serial no. 109116867, filed on May 21, 2020. The entirety of the above-mentioned patent application is hereby incorporated by reference herein and made a part of this specification.

BACKGROUND

Technical Field

The disclosure relates to a vapor chamber structure.

Description of Related Art

Generally, in a conventional vapor chamber, two plates are stacked with each other, followed by welding around the periphery to form a closed cavity inside, and a capillary structure and a working fluid are provided in the closed cavity. By transforming the working fluid between liquid state and vapor state, a uniform temperature can be achieved and heat can be conducted.

However, a main effect of the vapor chamber is that the heat is quickly diffused over an entire plate surface. That is, the vapor chamber mainly transfers heat in a planar manner (two-dimensional direction), and does not transfer heat in a vertical direction as fast as on the plate surface. Thus, the heat dissipation performance of the vapor chamber is reduced.

SUMMARY

The disclosure provides a vapor chamber structure configured to improve heat transfer efficiency of the vapor chamber in a vertical direction.

The vapor chamber structure of the disclosure is for heat dissipation of a heat source. The vapor chamber structure includes a housing, a first capillary structure and a working fluid. The housing has a heat absorption side and a heat dissipation side. The heat absorption side is in thermal contact with the heat source. The first capillary structure is disposed in the housing and is formed into a plurality of cavities isolated from each other, and each of the plurality of cavities is connected between the heat absorption side and the heat dissipation side. The working fluid is filled in the housing. Heat generated by the heat source is absorbed by the heat absorption side, whereby the working fluid is transformed from a liquid state to a vapor state, and the working fluid in the vapor state is transmitted to the heat dissipation side via the plurality of cavities. The heat is dissipated by the heat dissipation side, whereby the working fluid is transformed from the vapor state to the liquid state, and the working fluid in the liquid state is transmitted to the heat absorption side via the first capillary structure. Thereby, a cycle is defined.

Based on the above, in the vapor chamber structure, the first capillary structure in the housing is formed into the cavities isolated from each other, and the cavities are connected between the heat absorption side and the heat dissipation side. Accordingly, the working fluid in the liquid state, after being transformed to the vapor state by absorbing heat, can be directly transmitted between the cavities isolated from each other. Then, when the working fluid moves to the heat dissipation side and dissipates the heat, the working fluid that has been transformed to the liquid state can be immediately transmitted back to the heat absorption side via the first capillary structure. In this way, the first capillary structure is able to effectively shorten a transmission path of the working fluid in the liquid state, thereby improving heat transfer performance of the vapor chamber structure in the vertical direction. Therefore, a designer may design the first capillary structure and the mutually isolated cavities formed by the first capillary structure described above according to specific positions in the vapor chamber structure where the heat is mainly absorbed, so as to improve heat transfer speed at the specific positions and prevent thermal blockage.

To make the aforementioned more comprehensible, several embodiments accompanied with drawings are described in detail as follows.

DESCRIPTION OF THE EMBODIMENTS

Figure 1:
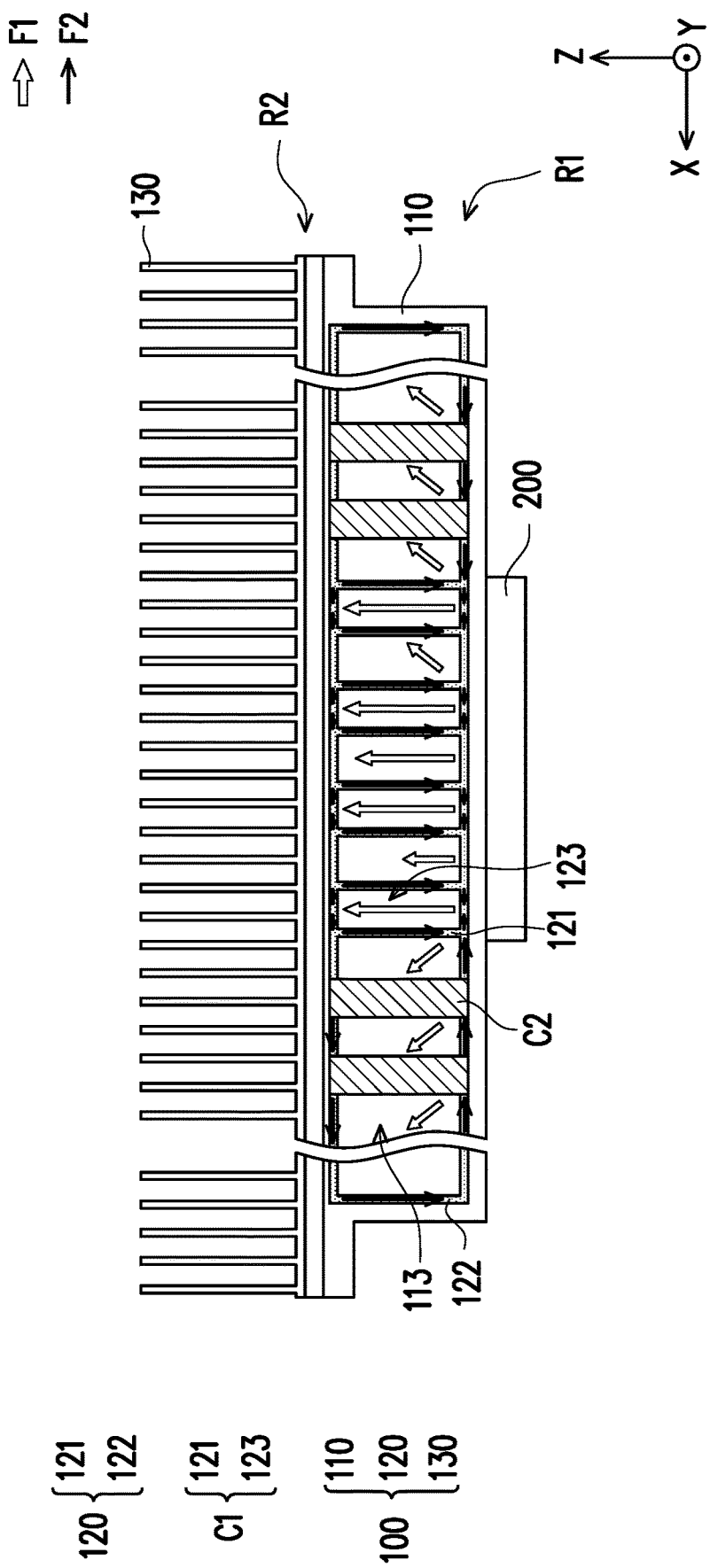
FIG. 1 is a partial cross-sectional view of a vapor chamber structure according to an embodiment of the disclosure.
Figure 2:
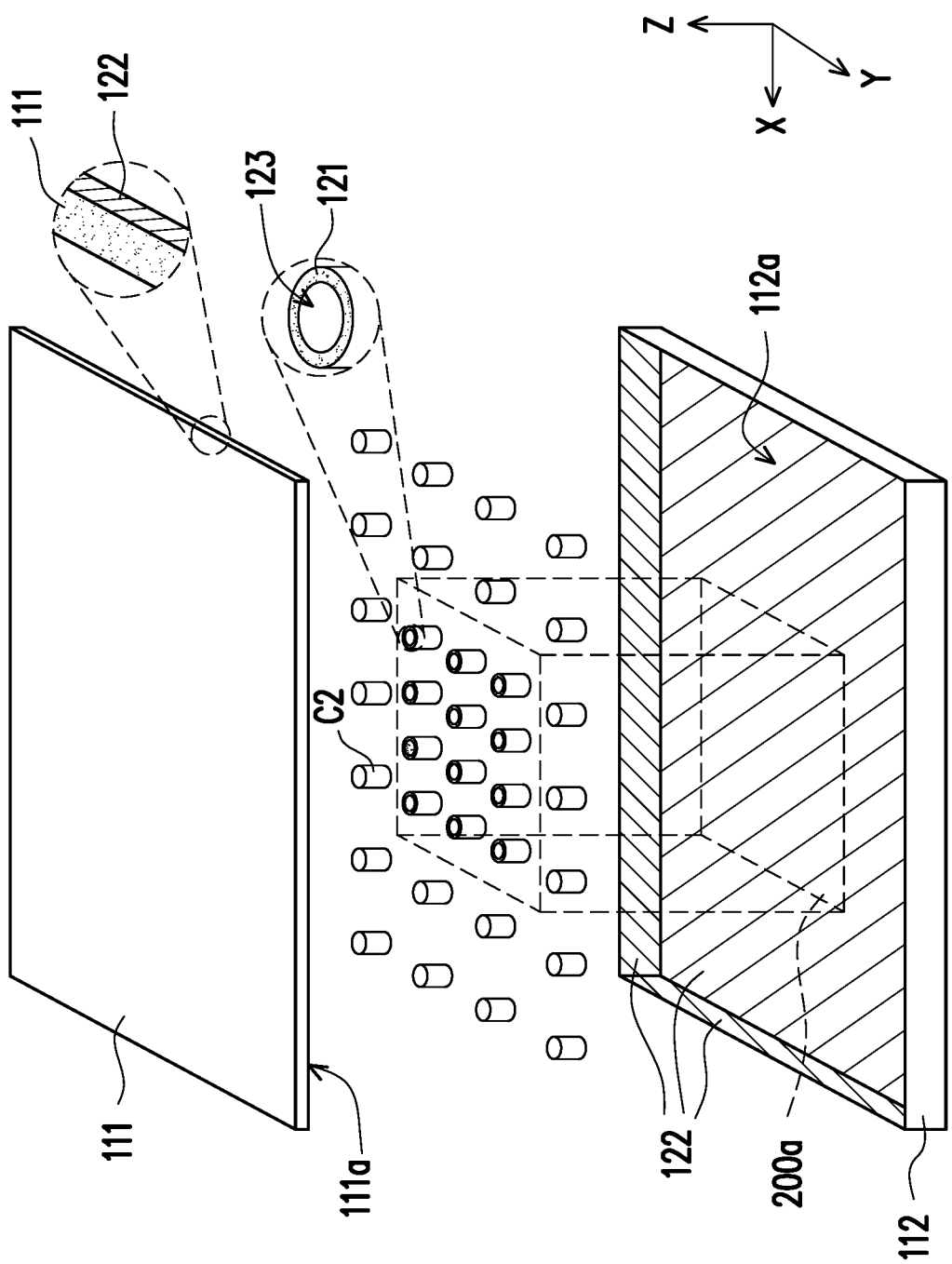
FIG. 2 is a schematic partial exploded view of the vapor chamber structure of FIG. 1.

FIG. 1 is a partial cross-sectional view of a vapor chamber structure according to an embodiment of the disclosure. FIG. 2 is a schematic partial exploded view of the vapor chamber structure of FIG. 1. In the above drawings, Cartesian coordinates X-Y-Z are also provided for the convenience of description of components. Referring to FIG. 1 and FIG. 2 together, a vapor chamber structure 100 includes a housing 110, a capillary structure 120, a heat sink 130, and a working fluid. The housing 110 includes a closed cavity 113, and a heat absorption side R1 and a heat dissipation side R2 corresponding to each other. A heat source 200, such as a processor or a display chip of an electronic device, is in thermal contact with the heat absorption side R1 of the housing 110. The heat sink 130, such as a heat dissipation fin, is disposed outside the housing 110 and located on the heat dissipation side R2. The capillary structure 120 is further divided into a first capillary structure 121 and a second capillary structure 122 that are disposed in different positions in the housing 110 and are connected to each other. The first capillary structure 121 and the second capillary structure 122 are, for example, formed together by sintering metal powder. The working fluid is filled in the closed cavity 113. Due to heat absorption or heat dissipation, there are two states of the working fluid, namely liquid state working fluid F2 and vapor state working fluid F1. Herein, the liquid state working fluid F2 is represented by solid arrows, and the vapor state working fluid F1 is represented by hollow arrows. When heat generated by the heat source 200 is absorbed by the liquid state working fluid F2 on the heat absorption side R1, the liquid state working fluid F2 is transformed to the vapor state working fluid F1, and the vapor state working fluid F1 moves to the heat dissipation side R2 of the housing 110. In this way, the heat is able to be transferred to the heat sink 130, and then escape from the vapor chamber structure 100 from the heat sink 130 by natural heat exchange (for example, cooling by natural convection with the external environment) or forced heat exchange (for example, forced cooling provided by a fan) or the like, thereby dissipating the heat of the heat source 200. In other embodiments not shown, the heat sink may be a heat pipe configured to transfer heat out of the vapor chamber structure.

As shown in FIG. 2, the second capillary structure 122 of the capillary structure 120 is disposed on an inner surface of the housing 110, that is, a periphery of the closed cavity 113. In detail, the housing 110 includes an upper housing 111 and a lower housing 112 that are welded and combined to form the closed cavity 113 (marked in FIG. 1). The second capillary structure 122 is distributed all over an inner surface of the lower housing 112 and a lower surface (inner surface) 111a of the upper housing 111. The heat source 200 abuts against the lower housing 112. Herein, an orthographic projection profile 200a of the heat source 200 on a bottom surface 112a of the lower housing 112 is shown. It is worth noting that the first capillary structure 121 of the present embodiment is provided in the closed cavity 113 and is formed into a plurality of cavities 123 isolated from each other. The first capillary structure 121 and the cavities 123 therein substantially define a plurality of hollow columns C1 standing in the housing 110 along a vertical direction (along the Z axis).

Herein, an XY plane is taken as a plate surface of the vapor chamber structure 100. Thus, an extension direction of the hollow columns C1 is substantially a normal direction of the plate surface, and the cavities 123 are connected between the heat absorption side R1 and the heat dissipation side R2 along the Z axis. In this way, as shown in FIG. 1, for one of the hollow columns C1, when the liquid state working fluid F2 on the heat absorption side R1 absorbs the heat and is transformed to the vapor state working fluid F1, the vapor state working fluid F1 moves to the heat dissipation side R2 via the cavities 123; when the vapor state working fluid F1 is transformed to the liquid state working fluid F2 due to heat dissipation, the liquid state working fluid F2 is immediately transmitted back to the heat absorption side R1 via the first capillary structure 121. Thereby, a cycle is completed.

Furthermore, the first capillary structure 121 is located within a contact range of the heat source 200 and the heat absorption side R1. That is, as shown in the dotted-line profile in FIG. 2, the hollow columns C1 defined by the first capillary structure 121 and the cavities 123 are located within a range of the orthographic projection profile 200a of the heat source 200 on the bottom surface 112a of the housing 110. This means, as shown by the flow of the working fluid in FIG. 1, when the vapor state working fluid F1 is transformed to the liquid state working fluid F2 on the heat dissipation side R2 due to heat dissipation, the liquid state working fluid F2 is immediately transmitted back to the heat absorption side R1 via the first capillary structure 121 for the next heat absorption. As is clear from the above, the first capillary structure 121 provides a shorter transmission path for the liquid state working fluid F2, so that the working fluid in the hollow columns C1 can effectively and quickly complete a thermal cycle. The orthographic projection profile 200a corresponds to a range of abutting contact (thermal contact) between the heat source 200 and the housing 110. Within this range, the heat of the heat source 200 is transferred to the vapor chamber structure 100 in the maximum amount. Therefore, by the hollow columns C1 located within the range of the orthographic projection profile 200a, the heat can be transferred to the heat dissipation side R2 at higher speed and heat transfer efficiency of the vapor chamber structure 100 is improved. In other words, in the vapor chamber structure 100 of the present embodiment, the hollow column C1 is provided in the closed cavity 113 corresponding to the position of the heat source 200 or a main heat absorption portion. By generating a plurality of phase transition circulation paths independent of each other for the working fluid, after heat is absorbed from the heat source 200, the heat can be smoothly and quickly transferred and dissipated, and the occurrence of thermal blockage in the vertical direction is avoided.

Conversely, in the case where the vapor chamber structure does not include the hollow column C1 described in the present embodiment, the liquid state working fluid F2 on the heat dissipation side R2 can be transmitted back to the heat absorption side R1 only via the second capillary structure 122, namely, the second capillary structure 122 disposed at an inner periphery of the housing 110 as shown in FIG. 2. The second capillary structure 122 provides a longer transmission path for a liquid state working fluid, and therefore reduces heat dissipation efficiency of the vapor chamber structure.

In another aspect, referring to FIG. 1 again, in the present embodiment, as the heat source 200 continuously generates heat, the cycle of the working fluid in the hollow columns C1 continuously occurs. That is, the vapor state working fluid F1 and the liquid state working fluid F2 exist at the same time. In this way, when the liquid state working fluid F2 is transmitted back to the heat absorption side R1 via the first capillary structure 121, it means that the liquid state working fluid F2 is distributed in the first capillary structure 121 and forms a barrier to prevent the vapor state working fluid F1 from escaping from the cavities 123. Accordingly, the first capillary structure 121 and the cavities 123 therein define a plurality of circulation spaces isolated from each other in the closed cavity 113, enabling the working fluid to perform heat absorption and heat dissipation in the hollow columns C1. Therefore, the vapor chamber structure 100 provides good heat dissipation for the heat source 200 in the vertical direction (Z axis direction), which improves the overall heat dissipation efficiency.

In addition, referring to FIG. 2 again, the vapor chamber structure 100 of the present embodiment further includes a plurality of solid columns C2 erected in the housing 110 and abutting between the inner surfaces (the lower surface 111a and the bottom surface 112a) of the housing 110. The solid columns C2 are provided surrounding the hollow columns C1 (the first capillary structure 121 and the cavities 123). The solid column C2 of the present embodiment serves as a structural support for the vapor chamber structure 100 to maintain a structural strength thereof, while maintaining the closed cavity 113 required for phase transition of the working fluid. The disclosure does not limit the arrangement manners of the hollow column C1 and the solid column C2. As described above, in the vapor chamber structure 100, the hollow column C1 is disposed corresponding to the main heat absorption portion that is in thermal contact with the heat source 200, and the solid column C2 is disposed at a portion other than the main heat absorption portion to maintain the structure.

Figure 3:
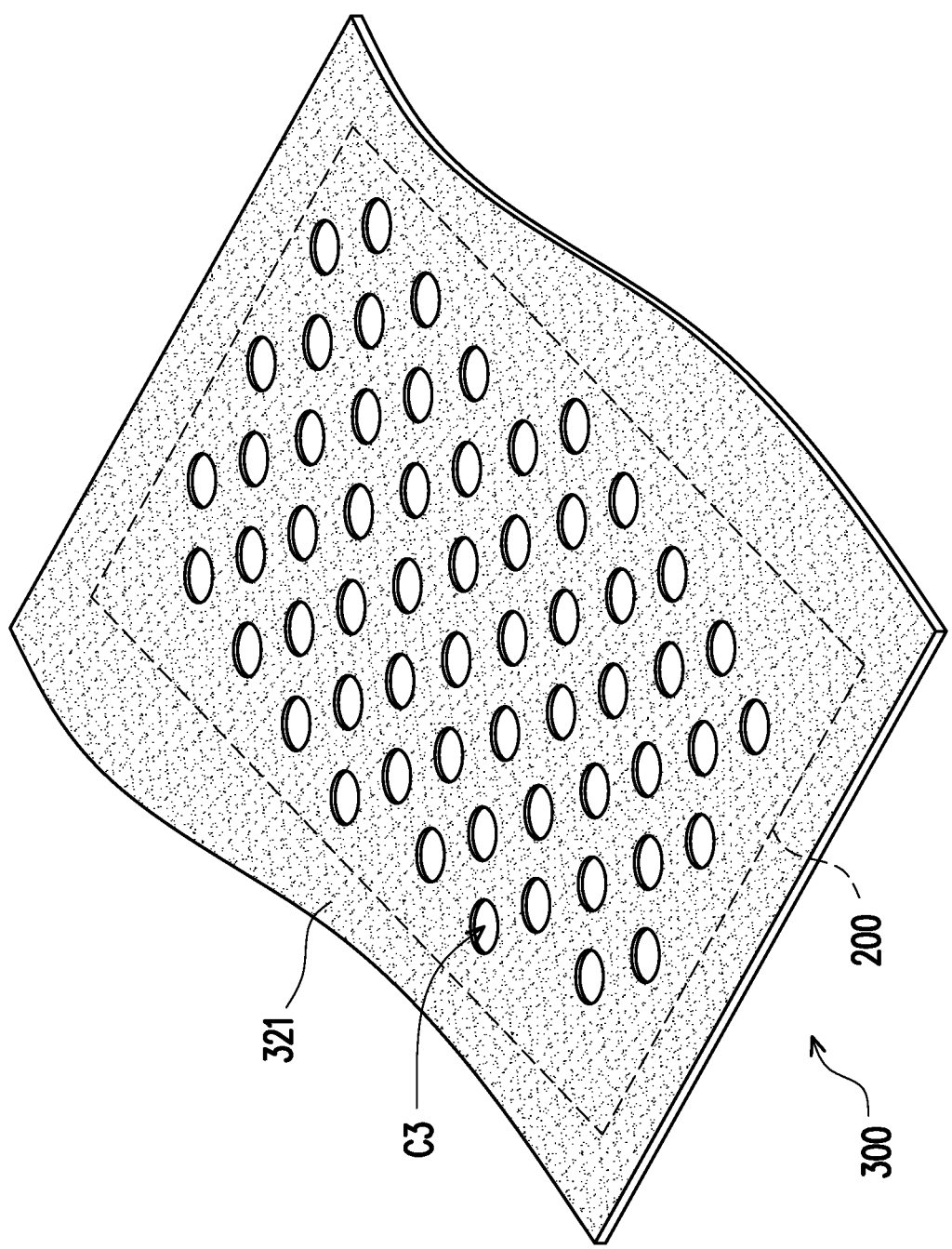
FIG. 3 is a schematic partial view of a vapor chamber structure according to another embodiment of the disclosure.

FIG. 3 is a schematic partial view of a vapor chamber structure according to another embodiment of the disclosure. Referring to FIG. 3, FIG. 3 shows a schematic internal view of a vapor chamber structure 300. In the present embodiment, a first capillary structure 321 substantially fills an internal space of a housing, and is further formed into a plurality of hollow columns C3 as shown. The heat source 200 is located at a bottom of the housing and corresponds to a part of the first capillary structure 321 and all of the hollow columns C3. Accordingly, in the vapor chamber structure 300 of the present embodiment, by phase transition of a working fluid filled in the first capillary structure 321 in accordance with heat absorption and heat dissipation, the overall heat dissipation efficiency is improved.

In summary, in the vapor chamber structure of the above embodiments of the disclosure, the first capillary structure in the housing is formed into the cavities isolated from each other, and the cavities are connected between the heat absorption side and the heat dissipation side. Accordingly, the working fluid in the liquid state, after being transformed to the vapor state by absorbing heat, can be directly transmitted between the cavities isolated from each other. Then, when the working fluid moves to the heat dissipation side and dissipates the heat, the working fluid that has been transformed to the liquid state can be immediately transmitted back to the heat absorption side via the first capillary structure.

Furthermore, as the heat source continuously generates heat, it means that the working fluid in the hollow columns continuously undergoes phase transition. Therefore, the transmission of the working fluid in the liquid state to the heat absorption side via the first capillary structure occurs at the same time as the transmission of the working fluid in the liquid state to the heat dissipation side via the cavities. Accordingly, the working fluid in the liquid state located in the first capillary structure further forms the barrier to prevent the working fluid in the vapor state from escaping from the cavities. Therefore, the phase transition of the working fluid in the hollow columns can be carried out smoothly. That is, the heat dissipation efficiency at the hollow columns can be improved accordingly.

In this way, the first capillary structure is able to effectively shorten a transmission path of the working fluid in the liquid state, thereby improving the heat transfer performance of the vapor chamber structure in the vertical direction. Therefore, a designer may design the first capillary structure and the mutually isolated cavities formed by the first capillary structure described above according to specific positions in the vapor chamber structure where the heat is mainly absorbed, so as to improve the heat transfer speed at the specific positions and prevent thermal blockage.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A vapor chamber structure for heat dissipation of a heat source, the vapor chamber structure comprising:
   a housing having a heat absorption side and a heat dissipation side, the heat absorption side being in thermal contact with the heat source;
   a first capillary structure disposed in the housing and formed into a plurality of cavities isolated from each other, wherein each of the plurality of cavities is connected between the heat absorption side and the heat dissipation side; a working fluid filled in the housing, wherein heat generated by the heat source is absorbed by the heat absorption side, whereby the working fluid is transformed from a liquid state to a vapor state, the working fluid in the vapor state is transmitted to the heat dissipation side via the plurality of cavities, the heat is dissipated by the heat dissipation side, whereby the working fluid is transformed from the vapor state to the liquid state, and the working fluid in the liquid state is transmitted to the heat absorption side via the first capillary structure, thereby defining a plurality of cycles; and
   a plurality of solid columns erected in the housing and abutting between the inner surfaces of the housing,
   wherein the first capillary structure is located within a contact range of the heat source and the heat absorption side,
   wherein a plurality of hollow columns are formed by the first capillary structure and a plurality of cavities in the first capillary structure,
   wherein an orthographic projection profile of the heat source is formed on a bottom surface of the housing, the orthographic projection profile corresponds to a range of contact of the heat source and the housing, the hollow columns are located within the range of the orthographic projection profile, and the solid columns are located outside the range of the orthographic projection profile,
   wherein the plurality of solid columns abut against an inner top wall and an inner bottom wall of the housing respectively to serve as a structural support for the housing and sustain a closed cavity of the housing, the inner top wall is opposite to the inner bottom wall, and the plurality of solid columns surround the hollow columns to maintain phase transition circulation in the housing,
   wherein a plurality of phase transition circulation paths independent from each other are generated in the hollow columns respectively.

2. The vapor chamber structure according to claim 1, wherein the working fluid in the liquid state is distributed in the first capillary structure and forms a barrier, and the barrier prevents the working fluid in the vapor state from escaping from the plurality of cavities.

3. The vapor chamber structure according to claim 1, wherein the first capillary structure fills an internal space of the housing, and the plurality of hollow columns are formed in a position corresponding to the heat source.

4. The vapor chamber structure according to claim 1, wherein the first capillary structure stands in the housing along a vertical direction, and the vertical direction is a normal direction of a plate surface of the vapor chamber structure.

5. The vapor chamber structure according to claim 1, further comprising:
   a second capillary structure disposed on an inner surface of the housing and connected to the first capillary structure.

6. The vapor chamber structure according to claim 5, wherein the first capillary structure and the second capillary structure are formed by sintering metal powder.

7. The vapor chamber structure according to claim 1, further comprising:
   a heat sink disposed outside the housing and located on the heat dissipation side.

8. The vapor chamber structure according to claim 1, wherein the plurality of solid columns are provided surrounding the plurality of cavities.

* * * * *